United States Patent [19]

Kubo et al.

[11] Patent Number: 5,531,603
[45] Date of Patent: Jul. 2, 1996

[54] DEVICE FOR ALIGNING CONTACTING PORTIONS OF CONTACTS IN IC SOCKET

[75] Inventors: Masaaki Kubo; Nanahiro Hayakawa, both of Tokyo, Japan

[73] Assignee: Yamaichi Electronics Co., Ltd., Tokyo, Japan

[21] Appl. No.: 338,737

[22] Filed: Nov. 9, 1994

[30] Foreign Application Priority Data

Nov. 11, 1993 [JP] Japan .................................. 5-307406

[51] Int. Cl.⁶ .................................. H01R 9/09
[52] U.S. Cl. .................................. 439/72; 439/331
[58] Field of Search .................................. 439/72, 73, 331, 439/70, 68, 71, 525

[56] References Cited

U.S. PATENT DOCUMENTS

| | | | |
|---|---|---|---|
| 4,547,031 | 10/1985 | Korsunsky | 439/331 X |
| 4,560,216 | 12/1985 | Egawa | 439/331 X |
| 4,936,784 | 6/1990 | Saito | 439/72 OR |

FOREIGN PATENT DOCUMENTS 3-71746  11/1991  Japan .

Primary Examiner—P. Austin Bradley
Assistant Examiner—Daniel Wittels
Attorney, Agent, or Firm—Wenderoth, Lind & Ponack

[57] ABSTRACT

In an IC socket including an IC placing section at a generally central area thereof and a large number of contacts arranged in an array along a pair of opposing sides of the IC placing section, so as to be electrically and physically connected to leads of an IC placed on a socket body, a device for aligning contacting portions of the contacts in the IC socket comprising a ruler plate mounted on the IC placing section, the ruler plate being provided at a pair of opposing sides thereof with grooves or holes for allowing contacting portions of the contacts to be loosely inserted therein and partition walls for isolating the respective adjacent grooves or holes, the ruler plate being fitted to the IC placing section and firmly secured to a predetermined position through positioning means, the contacting portions being inserted respectively in the grooves or holes and side surfaces of the contacting portions being abutted with inner surfaces of the ruler walls at the position where the ruler plate is firmly secured, thereby establishing relative positions of the contacting portions.

3 Claims, 4 Drawing Sheets

F I G. 2
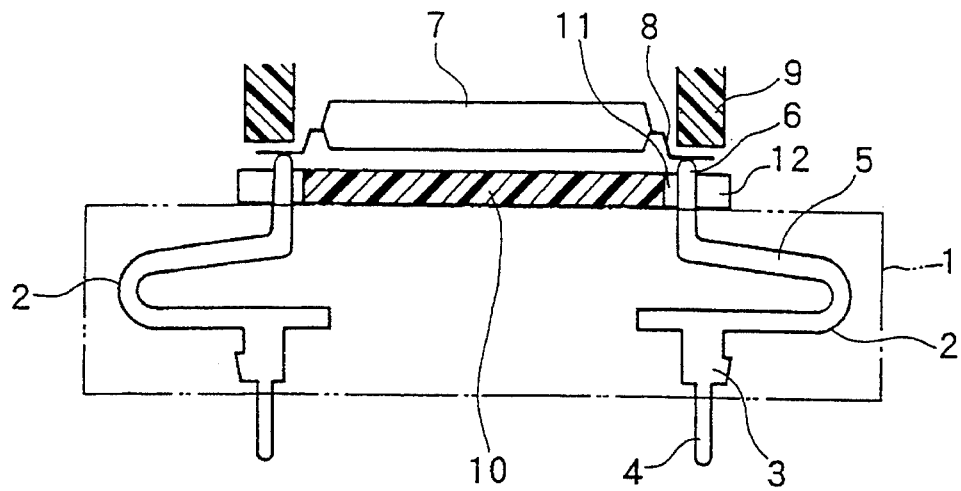
F I G. 3
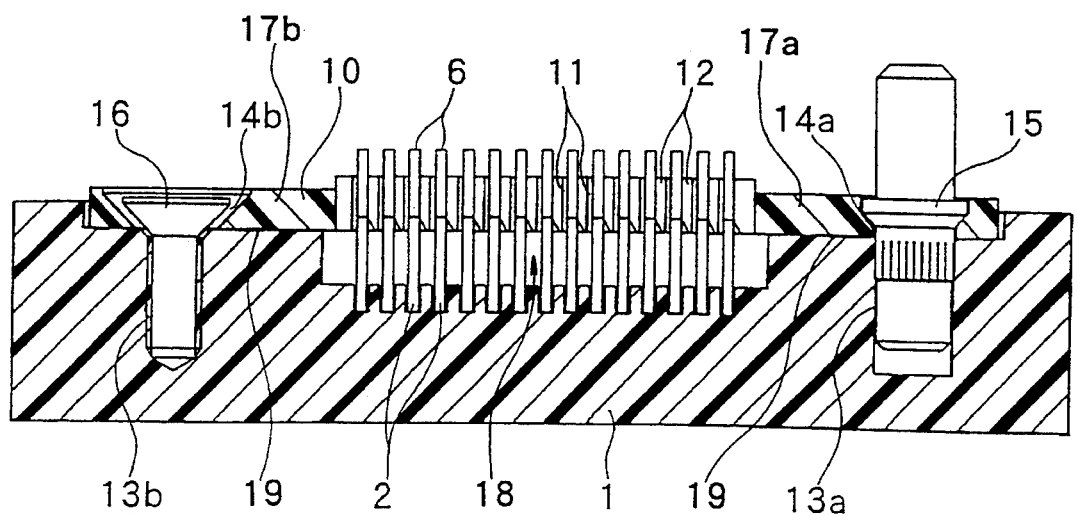

DEVICE FOR ALIGNING CONTACTING PORTIONS OF CONTACTS IN IC SOCKET

BACKGROUND OF THE INVENTION

1. Field of the invention

This invention relates to a device for aligning contacting portions of contacts, which contacts are implanted in a large number in an IC socket.

2. Brief Description of the Prior Art

Japanese Patent Publication No. Hei 3-71746 discloses an IC socket including a socket body, an IC receiving section formed in the socket body, an IC placing platform upwardly and downwardly movably disposed on the IC receiving section, and a large number of contacts implanted in an array in a socket substrate portion around the IC placing platform, the IC placing platform with an IC placed thereon being moved downwardly, so that IC terminals of the IC package are elastically brought into electrical and physical contact with elastic contact elements of the contacts, respectively. In this IC socket, contact positioning holes or grooves are formed in an outer peripheral portion of the IC placing platform, the elastic contact elements are received respectively into the positioning holes or grooves, and the elastic contact elements are restricted by walls for defining the positioning holes or grooves.

The above-mentioned invention takes advantage of the provision of the IC placing platform in the IC socket, and by receiving the contacting portions of the contacts in the positioning holes or grooves formed in the IC placing platform as an IC support means, the contacting portions of the contacts are moved following the lateral movement of the IC placing platform so that the leads of the IC placed on the IC placing platform may correspond to the contacting portions of the contacts. However, since the IC placing platform constitutes the means for laterally moving the contacting portions of the contacts following the lateral movement of the IC placing platform, the prior art device inherently has a problem for making the positions of the contacting portions of the contacts normally astable relative to the socket body.

Therefore, the above device cannot be applied to an IC socket which is not equipped with (does not require) the IC placing platform. For example, it cannot be used for an IC socket of the type in which IC leads are directly placed for electrical and physical contact serving the contacting portions of the contacts as support means without the use of an IC placing platform, and it rather becomes a harmful factor.

SUMMARY OF THE INVENTION

It is, therefore, an object of the present invention to provide a device for aligning contacting portions of contacts in an IC socket, in which when contacts are implanted in a socket body, the positions of the contacting portions of the contacts for permitting IC leads to overlie and contact are established at predetermined pitches relative to the socket body and those positions are fixed.

In order to achieve the above object, according to the present invention, there is provided in an IC socket including an IC placing section at a generally central area thereof and a large number of contacts arranged in an array along a pair of opposing sides of the IC placing section, so as to be electrically and physically connected to leads of an IC placed on a socket body, a device for aligning contacting portions of the contacts in the IC socket comprising a ruler plate mounted on the IC placing section, the ruler plate being provided at a pair of opposing sides thereof with grooves or holes for allowing contacting portions of the contacts to be loosely inserted therein and partition walls for isolating the respective adjacent grooves or holes, the ruler plate being fitted to the IC placing section and firmly secured to a predetermined position through positioning means, the contacting portions being inserted respectively in the grooves or holes and side surfaces of the contacting portions being abutted with inner surfaces of the ruler walls at the position where the ruler plate is firmly secured, thereby establishing relative positions of the contacting portions.

As mentioned above, by securing the ruler plate to the positioning holes, etc. formed in the socket body, the contacting portions of the contacts are pressed against inner surfaces of the ruler walls which isolate respective adjacent contacting point loosely inserting holes or grooves, thereby correctly establishing the respective pitches and existing positions. Namely, on the side of the IC socket, the contact arrangement corresponding to the arrangement pitches of IC leads is fixedly established, so that when the IC leads directly overlies and contacts the contacting portions of the contacts, there can be obtained an individually corresponding relation between each contacting portion and each IC lead.

The above and other objects, characteristic features and advantages of the present invention will become more apparent to those skilled in the art by the following description of the preferred embodiment of the invention, as illustrated in the accompanying drawings.

BRIEF DESCRIPTION OF THE DRAWINGS

FIG. 2 is a cross-sectional view taken along line A—A of FIG. 1;

FIG. 3 is likewise a cross-sectional view taken along line B—B of FIG. 1;

DETAILED DESCRIPTION OF THE EMBODIMENTS

Figure 1:
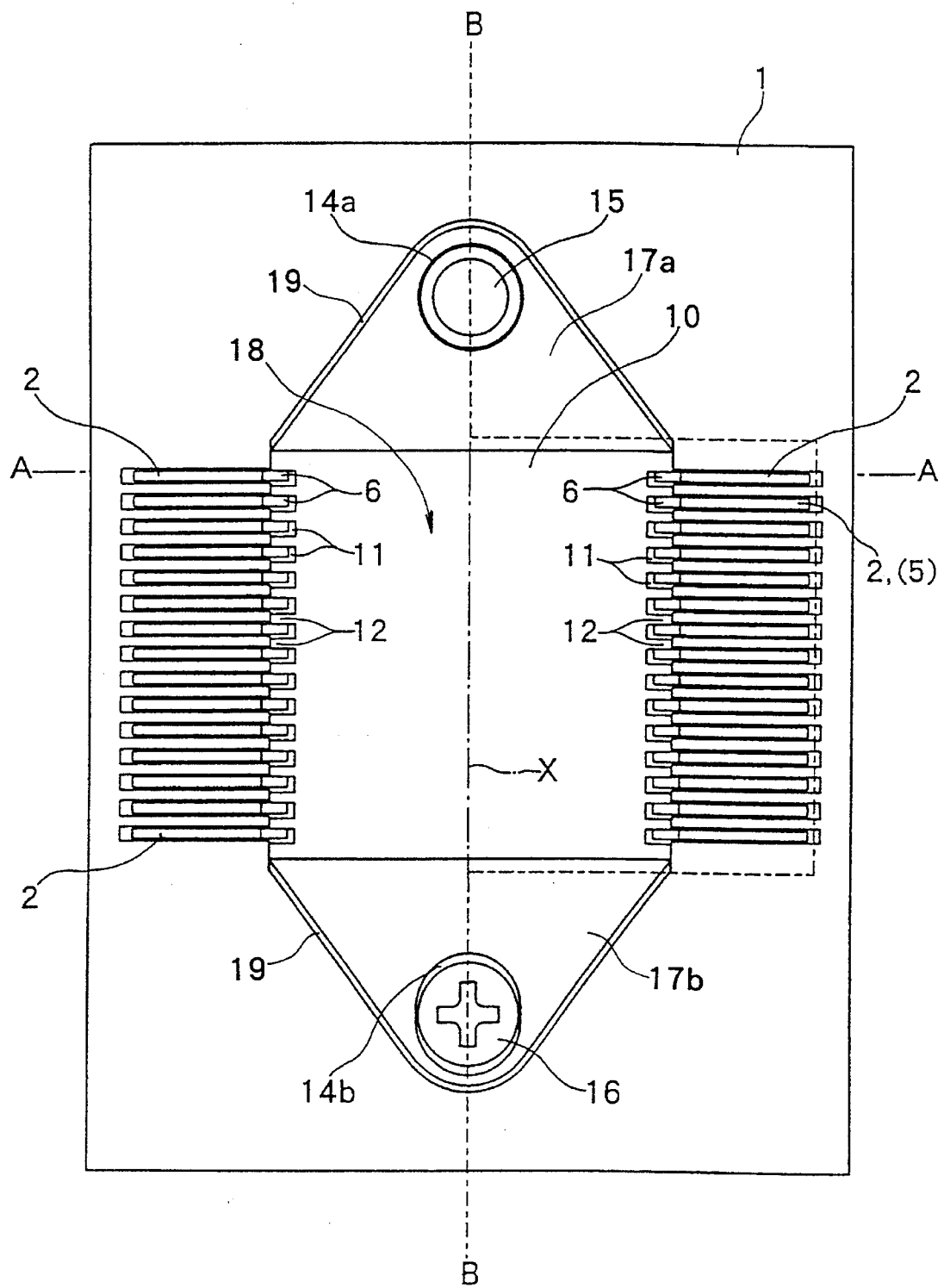
FIG. 1 is a plan view of an IC socket according to one embodiment of the present invention.
Figure 4:
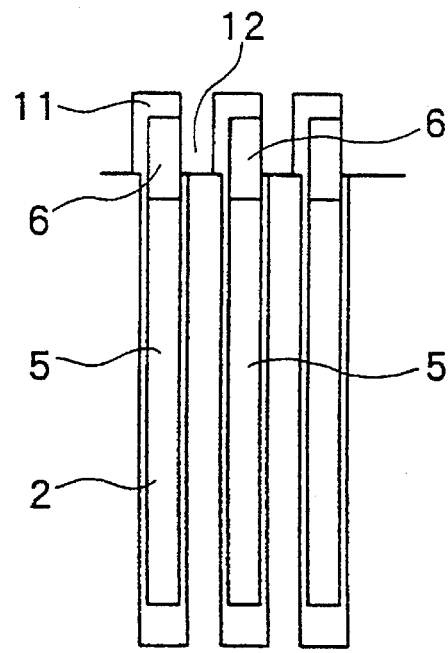
FIG. 4 is an enlarged plan view of an important portion of FIG. 3.

Embodiments of the present invention will be described with reference to FIGS. 1 to 7 inclusive. However, those embodiments are by no means limitative.

A socket body 1 formed of an insulating substrate has a large number of contacts 2 which are arranged, in an array, on opposing two sides of an IC placing section. Each of the contacts 2 has an implanting portion 3, a male terminal 4 extending from the implanting portion 3 downwardly of the socket body 1, and an elastic contact element 5 extending from the implanting portion 3 toward an upper surface side of the socket body 1.

The elastic contact element 5 can be elastically shifted upwardly and downwardly toward and away from the array of contacts 2 serving the implanting portion 3 as a fixed point. The elastic contact element 5 has a contact nose portion 6 formed on and extending upwardly from its free end which is to be shifted a maximum amount.

As illustrated, an IC 7 has a large number of leads 8 extending sideways from a pair of opposing sides at predetermined pitches. Although not illustrated, the IC 7 has a large number of leads intimately attached to a lower surface thereof. Depression of the leads 8 or body of the IC 7 downwardly by a depressing means 9 with the leads 8 placed on the contacting portions 6 of the contacts 2 causes the elastic contact elements 5 to be flexed downwardly against their elasticity, so that a contact force will be materialized by reaction thereof.

The socket body 1 is provided with a ruler plate 10 mounted thereon and adapted to establish the positions of the contact none portions 6 relative to the socket body 1. The ruler plate 10 is fitted in a recess which forms an IC placing section 18 and secured through a positioning means.

Holes or grooves 11 for loosely receiving a large number of contacts corresponding to the contacting portions 6 of the contacts 2 are formed in the ruler plate 10 at its opposing two sides. Ruler walls 12 corresponding to the contacting portions 6 of the contacts 2 are defined by walls which isolate the holes or grooves 11.

Each of the holes or grooves 11 has a dimension enough for receiving the contacting portions 6 of the contacts 2 with a certain degree of play. The ruler walls 12 are served as positioning means which are pressed against side surfaces of the contacting portions 6 of the contacts 2 loosely received in the holes or grooves 11 so as to establish the positions of the contacting portions 6 of the contacts. A positioning and mounting hole 13a and a mounting hole 13b for integrally fixedly mounting the ruler plate 10 are formed in an upper surface of the socket body 1.

Two groups of the contacts 2 are arranged in parallel relation, and the IC placing section 18 is formed between the two groups of contacts 2, which contacts 2 are arranged in an array (i.e., side by side relation). The ruler plate 10 is provided on a pair of opposing sides thereof with the contacting point loosely inserting holes or grooves 11. Furthermore, the ruler plate 10 includes a pair of mounting seat plates 17a and 17b horizontally protruded from a pair of the remaining opposing sides. The mounting seat plate 17a is provided with a positioning and mounting hole 14a, whereas the other mounting seat plate 17b is provided with a mounting hole 14b. The positioning and mounting hole 14a and the mounting hole 14b are brought into a corresponding relation with the positioning and mounting hole 13a and mounting hole 13b formed in the support seat 19 of the socket body 1. A fixing pin 15 formed of a press-in pin is inserted into the positioning and mounting hole 14a and further pressure inserted into the corresponding positioning and mounting hole 13a for fixture. Likewise, a fixing pin 16 formed of a screw or the like is inserted into the mounting hole 14b and then fixedly threaded into the corresponding mounting hole 13b which forms a male-threaded hole. By doing this, the ruler plate 10 is integrally secured to a predetermined position of the socket body 1.

As shown in FIGS. 1 and 3, the ruler plate 10 is secured to the support seats 19 which are formed at an outer area of the pair of opposing sides of the IC placing section 18, with the pair of mounting seat plates 17a and 17b superposed on the support seats 19. A body portion of the ruler plate 10 is supported in a cavity forming the IC placing section 18 in a suspended-fashion by securing the mounting seat plates 17a and 17b to the support seats 19.

The mounting hole 13b is an elongated hole extending in and existing on a center line connecting the holes 13a and 13b, so that when the ruler plate 10 is laterally slightly moved due to positional establishment made by the fixing pin 16 and positioning and mounting holes 13a and 14a, the ruler plate 10 can be mounted in such established position by the fixing pin 16 without any trouble. In the above embodiment, both the press-in pin and screw are used as means for fixedly positioning the ruler plate 10.

As mentioned above, by fitting the ruler plate 10 to the IC placing portion 18 and fixing it to a predetermined position, the contacting portions 6 of the contacts 2 are loosely inserted into the contacting portion loosely inserting holes or grooves 11 of the ruler plate 10 and at the same time, one side surfaces of the contacting portions 6 are pressed against the inner surfaces of the ruler plate 12, thereby establishing the pitches and existing positions of the respective contact portions 6.

Preferably, the positioning and mounting hole 13a and the mounting hole 13b are arranged on a center line between the two groups of contacts 2, which contacts 2 are arranged in an array (i.e.,side by side relation), and the positioning and mounting hole 14a and the mounting hole 14b are arranged in positions corresponding thereto.

In other words, two groups of contacts 2 are arranged in an array on a pair of opposing sides of the IC placing section of the socket body 1, the above-mentioned holes 13a and 13b are arranged on the center line between the two groups of contacts 2, the contact portion loosely inserting holes or grooves 11 are arranged in an array on a pair of opposing sides of the ruler plate 10, and the above-mentioned holes 14a and 14b are arranged on the center line between the two groups of holes or grooves 11. In FIG. 1, the reference character X denotes the center line on which the holes 13a, 13b, 14a and 14b are arranged.

When the ruler plate 10 is thus fitted to the IC placing section 18 of the socket body 1 and fixed to the predetermined position, the contacting portions 6 of the contacts 2, while being loosely inserted in the contact loose insertion holes or grooves 11, are brought into abutment with the inner surfaces of the ruler wall 12, thereby being correctly positioned.

Figure 5A:
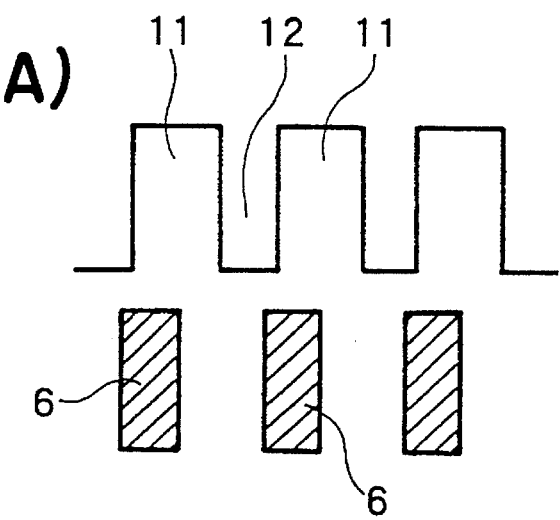
FIGS. 5A and 5B are plan views of contacting portions of contacts which are correctly positioned by a ruler wall according to the present invention.
Figure 5B:
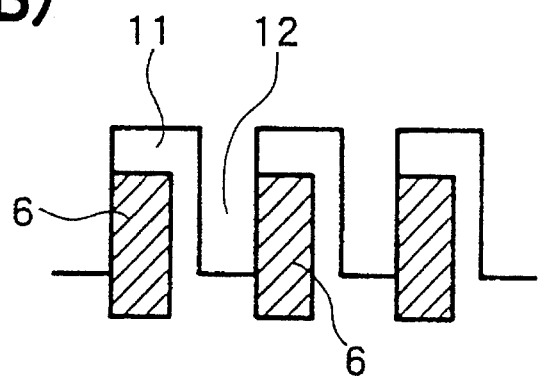
Figure 6:
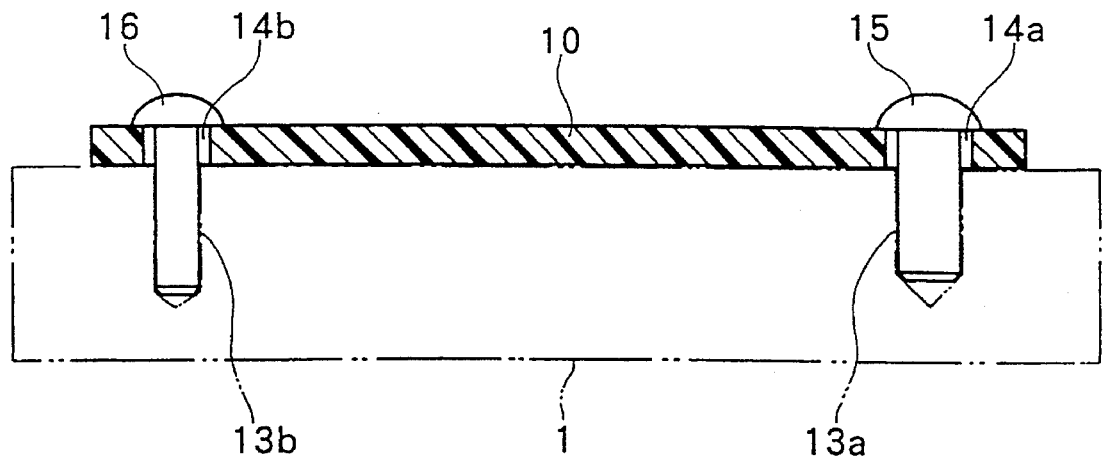
FIG. 6 is a schematic cross-sectional view of an IC socket according to another embodiment of the present invention.
Figure 7A:
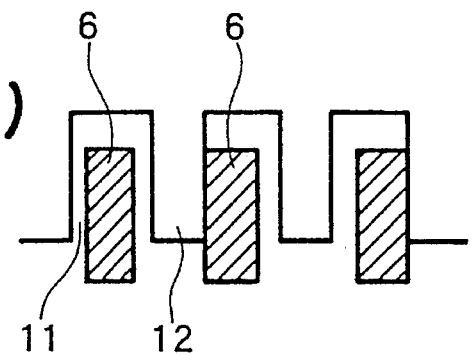
FIGS. 7A and 7B are plan views of an important portion showing another example of contacting portions of contacts which are correctly positioned by a ruler wall of FIG. 6.
Figure 7B:
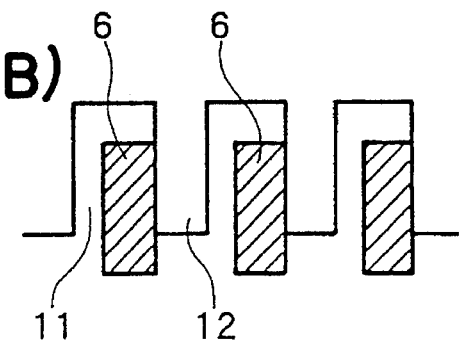

As a means for firmly securing the ruler plate 10 to the predetermined position of the socket body 1 through the positioning and mounting holes 13a and 14a and the mounting holes 13b and 14b, in FIG. 6, the holes formed in either the ruler plate 10 or the socket body 1, for example, the holes 14a and 14b formed in the ruler plate 10 are designed as elongated holes so that the ruler plate 10 may be laterally moved within the limited spaces of these elongated holes, as shown in FIGS. 7A and 7B, thereby enabling to adjust the positions of the contacting portions 6 of the contacts 2. As other means for securing the ruler plate 10 to a predetermined position of the socket body 1 through the holes 13a, 13n, 14a and 14b, the ruler plate 10, as shown in FIG. 3 and FIGS. 5A and 5B, is laterally immovably secured to the socket body 1 in such a manner as to be concentrical to the center of the positioning and mounting holes 13a and 14a, thereby correctly positioning the contacting portions 6 of the contacts 2. Both the securing pins 15 and 16 may be press-in pins or screws.

According to the present invention, the existing positions and pitches of the contact noses portions are fixed to predetermined positions relative to the socket body and these positions can be obtained through the ruler plate which is fitted to the IC placing section of the socket body and secured to the predetermined position. Therefore, this is very effectively used as a means for positioning the contacting portions of the contacts of the type in which the IC leads are placed directly on and contacted with the contacting portions of the contacts without using the IC placing platform as in the prior art.

In case the implanting pitches of the contacts become smaller in such a manner as to correspond to the very small arrangement pitches of the IC leads, the present invention is very effective when the contacting portions of the contacts, after implanting of the contacts, are arranged in an array in such a manner as to correspond to the IC leads so as to be electrically connected to the IC leads even in the presence of acceptable implanting errors of the contacts to the socket body.

It is to be understood that the forms of the invention herewith shown and described are to be taken as the preferred embodiments of the same, and that various changes in the shape, size and arrangement of parts may be resorted to without departing from the spirit of the invention or the scope of the subjoined claims.

What is claimed is:

1. In an IC socket including an IC placing section at a generally central area thereof and a large number of contacts arranged in an array along a pair of opposing sides of said IC placing section, so as to be electrically and physically connected to leads of an IC placed on a socket body, a device for aligning contacting portions of said contacts in said IC socket comprising a ruler plate mounted on said IC placing section, said ruler plate being provided at a pair of opposing sides thereof with grooves or holes for allowing contacting portions of said contacts to be loosely inserted therein and partition walls for isolating the respective adjacent grooves or holes, said ruler plate being fitted to said IC placing section and firmly secured to a predetermined position through positioning means, said contacting portions being inserted respectively in said grooves or holes and side surfaces of said contacting portions being abutted with inner surfaces of said partition walls at said position where said ruler plate is firmly secured, thereby establishing relative positions of said contacting portions.

2. A device for aligning contacting portions of contacts in an IC socket as defined in claim 1, in which said position where said ruler plate is firmly secured is adjustable relative to said socket body.

3. A device for aligning contacting portions of contacts in an IC socket as defined in claim 1, in which said ruler plate has a pair of mounting seat plates protruded from a pair of remaining opposing sides of said ruler plate, said mounting seat plates being secured respectively to a pair of support seats formed at an outside area of a pair of remaining opposing sides of said IC placing section through said positioning means.

* * * * *